(12) United States Patent
Rueb et al.

(10) Patent No.: US 7,576,410 B2
(45) Date of Patent: Aug. 18, 2009

(54) POWER TRANSISTOR

(75) Inventors: Michael Rueb, Faak am See (AT); Gerhard Schmidt, Wernberg-Wudmath (AT)

(73) Assignee: Infineon Technologies AG, Munich (DE)

( * ) Notice: Subject to any disclaimer, the term of this patent is extended or adjusted under 35 U.S.C. 154(b) by 225 days.

(21) Appl. No.: 11/528,821

(22) Filed: Sep. 28, 2006

(65) Prior Publication Data
US 2007/0069301 A1 Mar. 29, 2007

(30) Foreign Application Priority Data
Sep. 28, 2005 (DE) .................. 10 2005 046 427

(51) Int. Cl.
*H01L 21/8238* (2006.01)
(52) U.S. Cl. .................. 257/577; 257/401; 257/E51.04; 977/938
(58) Field of Classification Search .................. 257/104, 257/577, E51.04; 977/938
See application file for complete search history.

(56) References Cited

U.S. PATENT DOCUMENTS

| 6,566,704 | B2 * | 5/2003 | Choi et al. .................. 257/314 |
| 6,740,910 | B2 * | 5/2004 | Roesner et al. ............. 257/213 |
| 6,891,191 | B2 | 5/2005 | Xiao et al. |
| 6,930,343 | B2 * | 8/2005 | Choi et al. .................. 257/296 |
| 7,180,107 | B2 * | 2/2007 | Appenzeller et al. ........ 257/288 |
| 7,462,890 | B1 * | 12/2008 | Tombler et al. ............. 257/192 |
| 2004/0253805 | A1 * | 12/2004 | Dubin et al. ................ 438/618 |

FOREIGN PATENT DOCUMENTS

| DE | 10324 752 A1 | 1/2005 |
| DE | 102004003374 A1 | 8/2005 |

* cited by examiner

*Primary Examiner*—Eugene Lee
(74) *Attorney, Agent, or Firm*—Maginot, Moore & Beck

(57) ABSTRACT

A power transistor has a source region, a drain region, a semiconductor body arranged between the source region and the drain region, and a plurality of nanotubes. The plurality of nanotubes are connected in parallel and disposed in the semiconductor body such that the plurality of nanotubes are electrically insulated from the semiconductor body and electrically connect the source and drain regions of the transistor. The power transistor also includes at least one diode formed in the semiconductor body. A portion of the at least one diode formed in the semiconductor body is configured to act as a gate electrode for the transistor.

19 Claims, 3 Drawing Sheets

PRIOR ART

POWER TRANSISTOR

CROSS-REFERENCE TO RELATED APPLICATIONS

This application claims priority from German patent application no. DE 10 2005 046 427.0, filed Sep. 28, 2005, which is incorporated herein by reference in its entirety.

1. Field

The invention relates to a power transistor.

2. Background

The range of applications for power transistors has increased continuously in recent years: prominent fields of use include the control and regulation of loads, lamps, motors, heating systems and also automotive engineering.

Power transistors have in the meantime become able to process voltages of up to 1000 V. CoolMOS power switches achieve optimum on resistance values of approximately 2.4 $\Omega mm^2$. Obtaining a lowest possible on resistance is a primary aim here since the power losses that occur can be considerably reduced in this way.

In order to further improve the on resistance values mentioned above, power transistors based on nanowires connected in parallel have been developed.

A power transistor of this type has a source contact, a drain contact, a semiconductor structure (semiconductor body) provided between source contact and drain contact, and a gate, via which it is possible to control a current flow between source contact and drain contact through the semiconductor structure. The semiconductor structure has a plurality of nanowires which are connected in parallel and are arranged such that each nanowire forms an electrical connection between the source contact and the drain contact.

Nanowires are one-dimensional structures that may have metallic properties or semiconductor properties. In this context "one-dimensional" means that on account of the small dimensions of the nanowires (nanometers range), the individual energy levels of the electrons are further apart from one another than the thermal energy (~25 meV), so that electrons stay only in a conduction channel. Nanowires may be for example tubes ("hollow" on the inside) (referred to hereinafter as "nanotubes"), thin wires ("filled" with material), thin areas or else individual atomic chains.

The use of nanowires makes it possible to produce power transistors whose on resistance per unit area is orders of magnitude smaller and maximum current densities obtained here are orders of magnitude greater than in the case of conventional power switches: thus, given a nanowire density of 100 nanowires/$\mu m^2$, the on resistance is already a factor of 20 lower and the maximum current density a factor of 100 greater than in the case of conventional power transistors, for example silicon power switches.

In addition, due to internal leakage effects, the short-circuit current within an individual nanowire is limited, for example to approximately 24 µA in the case of a carbon nanotube. Thus, the power transistor may accordingly also be used as a starting current limiter.

In the power transistor mentioned above, the electronic properties of the nanowires, for example carbon nanotubes or other one-dimensional structures, are used to produce components pertaining to power electronics (switching of several amperes) which, by virtue of their nanostructured construction, achieve significantly better performance data than conventional power components. It is thereby possible for significantly higher currents/voltages than in the case of conventional nano electronic components (0.1-5 V, 25 µA) to be processed, for example voltages of up to more than 600 V. What is crucial in this case is the combination of a plurality of nanowires connected in parallel and the high charge carrier mobility in these one-dimensional structures, in association with a scaling specification for the length of said nanowires.

The nanowires may have, in principle, an arbitrary structure and comprise material having semiconductor properties, for example silicon or carbon, use being made of carbon nanotubes, in particular. The low on resistance that can be obtained with nanowires is based on the fact that electrons conducted through a nanowire are scattered with a very much lower probability statistically than electrons which flow through an extended semiconductor crystal. Thus, by way of example, carbon nanotubes exhibit the highest mobility ever measured at room temperature of above 100 000 $cm^2/Vs$.

FIG. 1 shows a known embodiment of a power transistor in which nanowires are used.

The embodiment 1 shown in FIG. 1 has a source contact 2 (source region), a drain contact 3 (drain region), a plurality of nanowires 4, a gate 5, a gate terminal 6, a first insulation layer 7, and a second insulation layer 8.

The nanowires 4 are arranged parallel and essentially equidistantly with respect to one another, the upper ends of the nanowires 4 being electrically connected to the source contact 2, and the lower ends of the nanowires 4 being electrically connected to the drain contact 3. The gate 5 is configured in the form of a gate layer penetrated by the nanowires 4, the nanowires 4 being electrically insulated from the gate 5 (the gate layer). This provides a coaxial arrangement of the gate electrode relative to the nanowires, thus resulting in the best possible capacitive coupling of the gate electrode to the nanowire. The length of the nanowires is preferably ((0.2 µm)*(maximum value of the voltage present at the power transistor (in volts))). The thickness of the gate layer 5 is for example one third of the distance between the source contact 2 and the drain contact 3. The gate layer 5 is generally situated closer to that contact whose potential is closest to the grounding potential (here: the drain contact). The gate layer 5 may have for example a square, circular or else annular form.

Depending on the dielectric strength to be obtained for the power transistor, a recommended length of the nanowires is 0.2 µm per applied volt of voltage, i.e. for example a length of 15 to 25 µm given an operating voltage of 100 volts. Nanowires of this length have a very high mobility of approximately 100 000 $cm^2/Vs$.

FIG. 2 shows a second known embodiment 20 of a power transistor. A significant difference from the embodiment shown in FIG. 1 is that the gate is realized in the form of a plurality of gate strips 5', the longitudinal orientation of which runs perpendicular in each case to the orientation of the nanowires 4, that is to say points out of the plane of the drawing or into the plane of the drawing, and the transverse orientation of which corresponds to the orientation of the nanowires 4. The nanowires 4 are arranged within trenches 21. Each gate strip 5' is electrically insulated from the nanowires 4 by insulating layers (gate oxide layers) 22. Further insulating layers (oxide layers) 23 are provided above and below the gate strips 5'.

The power transistors shown in FIGS. 1 and 2 have the disadvantage that they can only be used for the low-voltage range. Therefore, what is needed is a power transistor which has operating parameters just as good as those of the power transistors shown in FIGS. 1 and 2 but can also be used for the high-voltage range.

SUMMARY

According to one embodiment, a power transistor has a source region, a drain region, a semiconductor body arranged between the source region and the drain region, and a plurality of nanotubes. The plurality of nanotubes are connected in parallel and disposed in the semiconductor body such that the plurality of nanotubes are electrically insulated from the semiconductor body and electrically connect the source and drain regions of the transistor. The power transistor also includes at least one diode formed in the semiconductor body. The at least one diode is configured such that corresponding voltage profiles which occur in a diode off-state case within the at least one diode serve as gate potentials for the switching of the power transistor.

According to another embodiment, a power transistor comprises a source region, a drain region, a semiconductor body arranged between the source region and the drain region, and a plurality of nanotubes connected in parallel and disposed in the semiconductor body. The plurality of nanotubes are electrically insulated from the semiconductor body and electrically connecting the source and drain regions. The power transistor also includes at least one diode formed in the semiconductor body. The at least one diode being configured such that corresponding voltage profiles which occur in a diode off-state case within the at least one diode brings about a pinch-off of a current flow between the source region and the drain region through the nanotubes.

BRIEF DESCRIPTION OF THE DRAWINGS

The invention is explained in more detail below in exemplary embodiment with reference to the figures, in which.

DESCRIPTION

Figure 1:
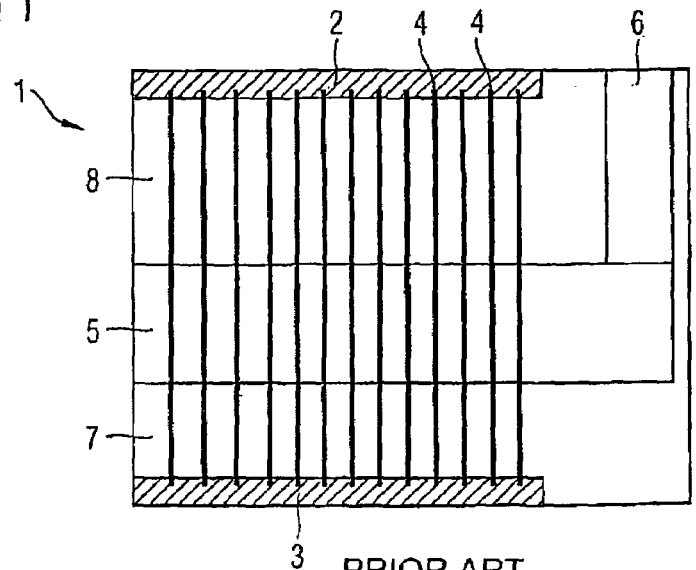
FIG. 1 shows a first known embodiment of a power transistor in a cross-sectional illustration.
Figure 2:
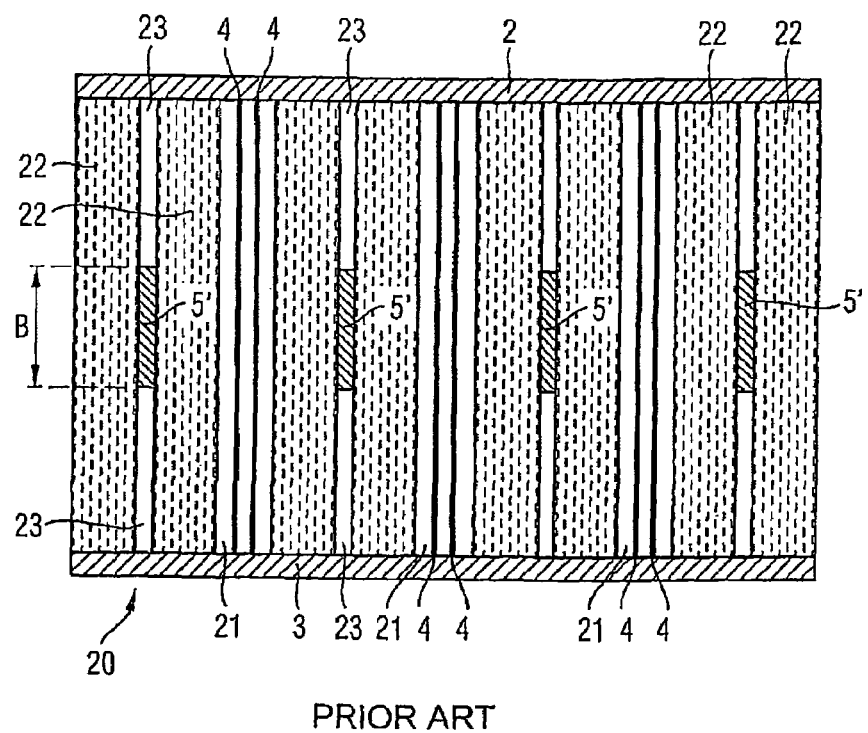
FIG. 2 shows a second known embodiment of a power transistor in a cross-sectional illustration.

The power transistor according to one embodiment of the invention has a source region, a drain region, a semiconductor body arranged between the source region and the drain region, and also a plurality of nanotubes (nanowires) which are connected in parallel, permeate the semiconductor body, are electrically insulated from the latter and electrically connect the source region to the drain region. There are formed in the semiconductor body one or a plurality of diodes configured such that corresponding voltage profiles which occur in the diode off-state case within the diodes serve as gate potentials for the switching of the power transistor.

The power transistor according to the embodiment renders the provision of complicated gate structures superfluous. The semiconductor body itself serves as a gate structure. However, said semiconductor body is present anyway and need not be produced separately with high production engineering outlay, in contrast to the gate structures described in the prior art. Furthermore, the use of the semiconductor body as a "gate electrode" has the advantage that the thickness of the insulation structure which electrically insulates nanotubes from the semiconductor body can turn out to be very thin since, in the diode off-state case, the potential difference to be reduced between the source region and the drain region is already reduced by the semiconductor body itself and the nanotubes.

The diodes are preferably configured such that the vertical potential increases or decreases along the nanotubes.

In one embodiment, the semiconductor body has a layer of a first conduction type and also a layer of a second conduction type, which is arranged on said layer and is electrically insulated from the source region, the diodes being formed from the junctions between the layer of the first conduction type and the layer of the second conduction type.

One or a plurality of gate electrodes (depending on whether one or a plurality of diodes are provided) which simultaneously function as anode electrodes of the diodes may be arranged on the layer of the second conduction type.

The drain region may be formed from a metal-containing layer which simultaneously functions as a transistor drain electrode and as a diode cathode electrode. As an alternative, the drain region may be formed from a semiconductor layer, on the underside of which is arranged an electrode which simultaneously functions as a transistor drain electrode and as a diode cathode electrode.

The diode or the diodes may be configured in a variety of ways. By way of example, it is possible to provide compensation structures of the second conduction type in the layer of the first conduction type, said compensation structures being doped such that they may bring about an effective depletion of charge carriers present in the semiconductor body in the diode off-state case. The compensation structures may be for example pillar-type zones connected to the semiconductor layer of the second conduction type.

Advantageously, the first conduction type is the n type, and the second conduction type is the p type.

At least one embodiment of the invention may comprise a structure which can be used as a high-voltage power switch (Ubr (=maximum reverse voltage/breakdown voltage)>200 V) with an extremely low on resistance.

Low on resistances are obtained by means of CoolMOS technology, by way of example. This technology based on the compensation principle nowadays achieves area-specific on resistances of 2.4 $\Omega mm^2$ at a breakdown voltage of 600 V.

A further reduction of the on resistance is difficult from today's standpoint. The reasons for this include, together with the limitations in the lithography equipment available nowadays, the process fluctuations in epitaxy and implantation.

Power switches realized on the basis of SiC basic material are also of interest in this context. Such components have already been demonstrated in principle, but they are not yet commercially available. The reasons for this are primarily the low channel mobility in SiC and further material-dictated problems.

The reduction of the on resistance that is obtained according to an embodiment of the invention is based on the use of so-called carbon nanotubes in the region of the electron conduction path. In this context, reference should be made in particular to the patent application having the official identification DE 10 2004 003 374.9, which explains technical principles in this regard.

Nanotubes have an extremely high mobility for electrons on account of their structural construction. By the application of an electric field, a depleted zone may be built up in nanotubes in a manner similar to that in a semiconductor.

This means that by applying or switching off a suitable voltage (order of magnitude 10-20 V), it is possible to switch on or off a current-conducting path in a nanotube which is incorporated between two electrodes (source, drain). The voltage is applied or switched off at a third electrode arranged in direct proximity to the nanotube and between source and drain.

The dielectric strength of the transistor may correspond to a length of the gate region, that is to say the length of the depleted region in the nanotube. For instance, 0.3 μm may correspond to approximately 1 V dielectric strength, i.e. a gate length or nanotube length of 180 μm may be required for a dielectric strength of about 600 V.

Prior art solutions typically required very complicated gate constructions. The latter comprised, under certain circumstances, thick oxides (thickness up to a few μm) and/or voltage dividers, as well as arrangements of many individual gates, as explained previously.

The power transistor according to at least one embodiment of the invention uses the depleted region of a power diode (which acts as a natural voltage divider in the vertical direction) as a coaxial gate electrode for a nanotube transistor.

At least one embodiment of the invention makes use of transistors which require a gate voltage relative to source for pinching off the current flow: the polarity is dependent on the conduction type of the nanotube (p or n) (see FIG. 1; assumption: conductive nanotube).

The drift zone of a high-voltage diode may act like a natural voltage divider, i.e. at each point a specific voltage with respect to source is set which can pinch off the nanotube at said point.

According to at least one embodiment of the invention, therefore, "an infinite number of individual gates" may be produced which are all at an individual potential that differs from the source potential and which may be arranged in the vertical direction (in the case of a vertical construction of the power transistor) along the nanotubes.

The gate length (i.e. the vertical extent of the "individual gates") may be given by the required dielectric strength of the nanotubes.

In order to achieve a rapid build-up and reduction of the breakdown voltage (=closing and opening, respectively, of the nanotube current path), the gate of the nanotube (=drift zone of the diode) may be embodied as a charge-compensated arrangement of p- and n-doped silicon layers. The charge of the nanotube influences the charge balance in this case, that is to say may be kept in the silicon doping; i.e. the nanotube may be interpreted as part of the semiconductor body with regard to the charge balance.

An exemplary power transistor according to at least one embodiment of the invention may afford the following advantages: the gate oxide thicknesses (=sidewall oxide in the nanotube trench) are kept small. Furthermore, there is no need for complicated gate arrangements with many gates at different potentials.

It may be advantageous, therefore, to use the space charge zone of a high-voltage diode as a gate electrode for the switching of carbon nanotubes.

In general, it is conceivable for an array of nanotubes to be positioned alongside one another in a long trench. In this way it is possible to accommodate very many nanotubes in a diode. A "typical" power transistor may contain a few tens of thousands of nanotubes.

Before describing further embodiments of the present invention in more detail, it should be noted that objects with the same or similar functional properties are denoted with the same reference signs. Unless explicitly noted otherwise, the description with respect to objects with similar or equal functional properties can be exchanged with respect to each other.

Figure 3:
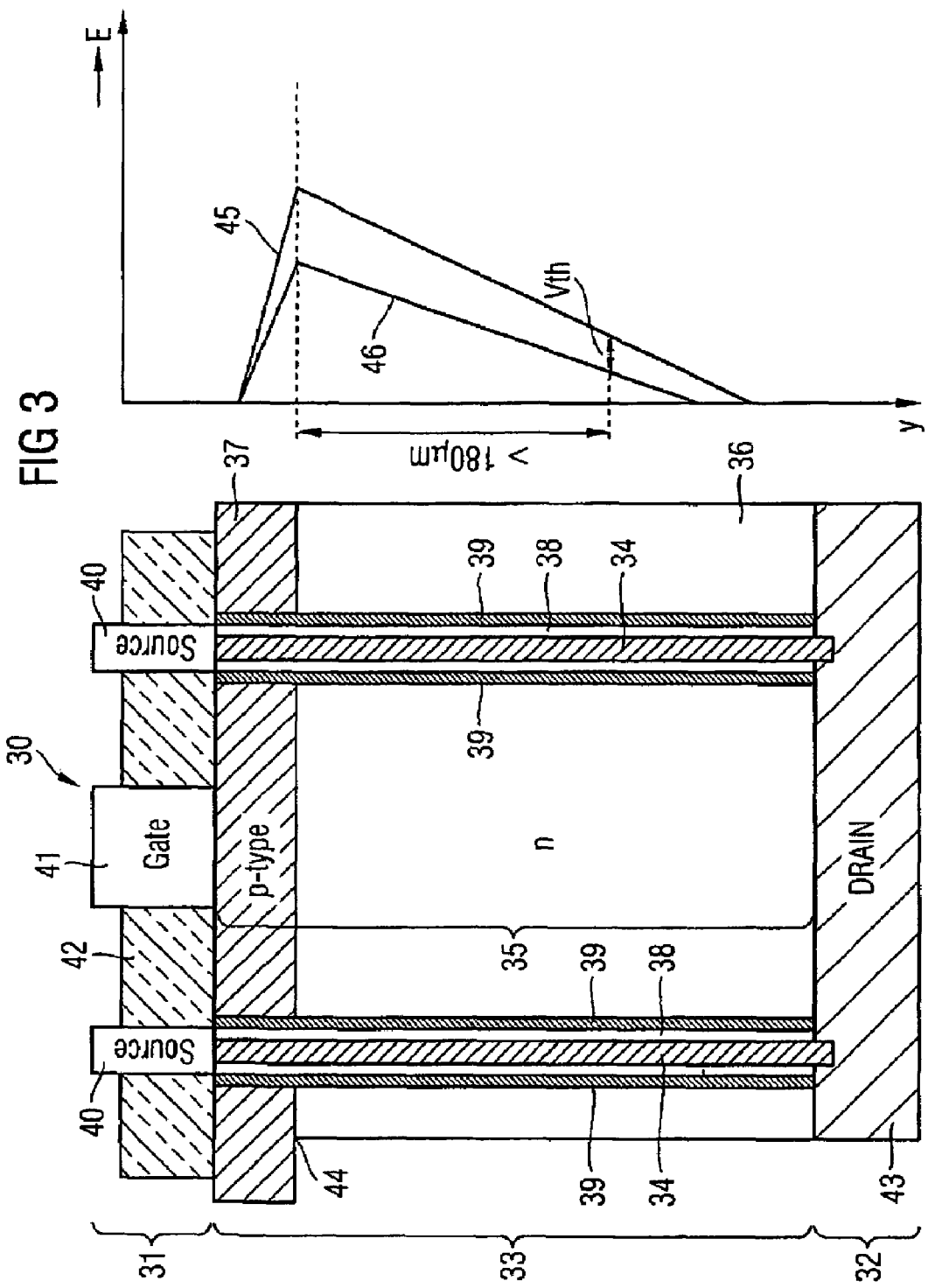
FIG. 3 shows a first embodiment of a power transistor according to the invention in a cross-sectional illustration.

FIG. 3 shows an embodiment of a power transistor 30 according to an embodiment of the invention. The power transistor 30 has a source region 31, a drain region 32, a semiconductor body 33 arranged between the source region 31 and the drain region 32, and also a plurality of nanotubes 34 which are connected in parallel, permeate the semiconductor body 33, are electrically insulated from the latter and electrically connect the source region 31 to the drain region 32. There are formed in the semiconductor body 33 a plurality of diodes 35 (only one diode can be seen here) configured such that corresponding voltage profiles which occur in the diode off-state case within the diodes 35 serve as gate potentials for the switching of the power transistor 30, 50.

In this embodiment, the semiconductor 33 has an n-doped layer 36 and also a p-doped layer 37. The nanotubes 34 are provided in trenches or tubes 38 and are electrically insulated from the semiconductor body 33 by insulation structures 39.

The nanotubes 34 are contact-connected by conductive source terminals 40, and the diode 35 (to put it more precisely the p-doped layer 37 functioning as an anode region) that can be seen in FIG. 1 is contact-connected by a gate terminal 41, which may equally be judged to be an anode electrode of the diode 35. The source terminals 40 are electrically insulated from the gate terminal 41 by an insulation layer 42.

In this embodiment, a layer 43 comprising conductive material (for example metal) simultaneously forms the drain electrode of the power transistor 30 and also the cathode electrode of the diode 35.

If the diode is reverse-biased by a corresponding voltage value being applied to the gate terminal 41, then a space charge zone arises within the semiconductor body 33 at a junction 44 between the p-doped layer 37 and the n-doped layer 36 and causes potential gradients to arise between the nanotubes 34 and corresponding regions of the n-doped layer 36, which potential gradients bring about the pinch-off of the current flow between the source terminals 40 and the drain terminal 43 through the nanotubes 34.

The entire semiconductor body 33 thus functions as a gate electrode. This has the advantage first of all that the "gate electrode" may be relatively simple to produce. Moreover, the thickness of the insulation structure 39 can turn out to be very small since the gate electrode itself has a very high dielectric strength.

Shown on the right in FIG. 3 is a profile of the electric field strength 45 that occurs between the gate terminal 41 and the drain terminal 43, and also a field profile of the electric field strength 46 that occurs between the source terminals 40 and the drain terminal 43, which occur in the off-state case of the diode 35 within the semiconductor body 33 in the vertical direction along the tubes/trenches 38.

Figure 4:
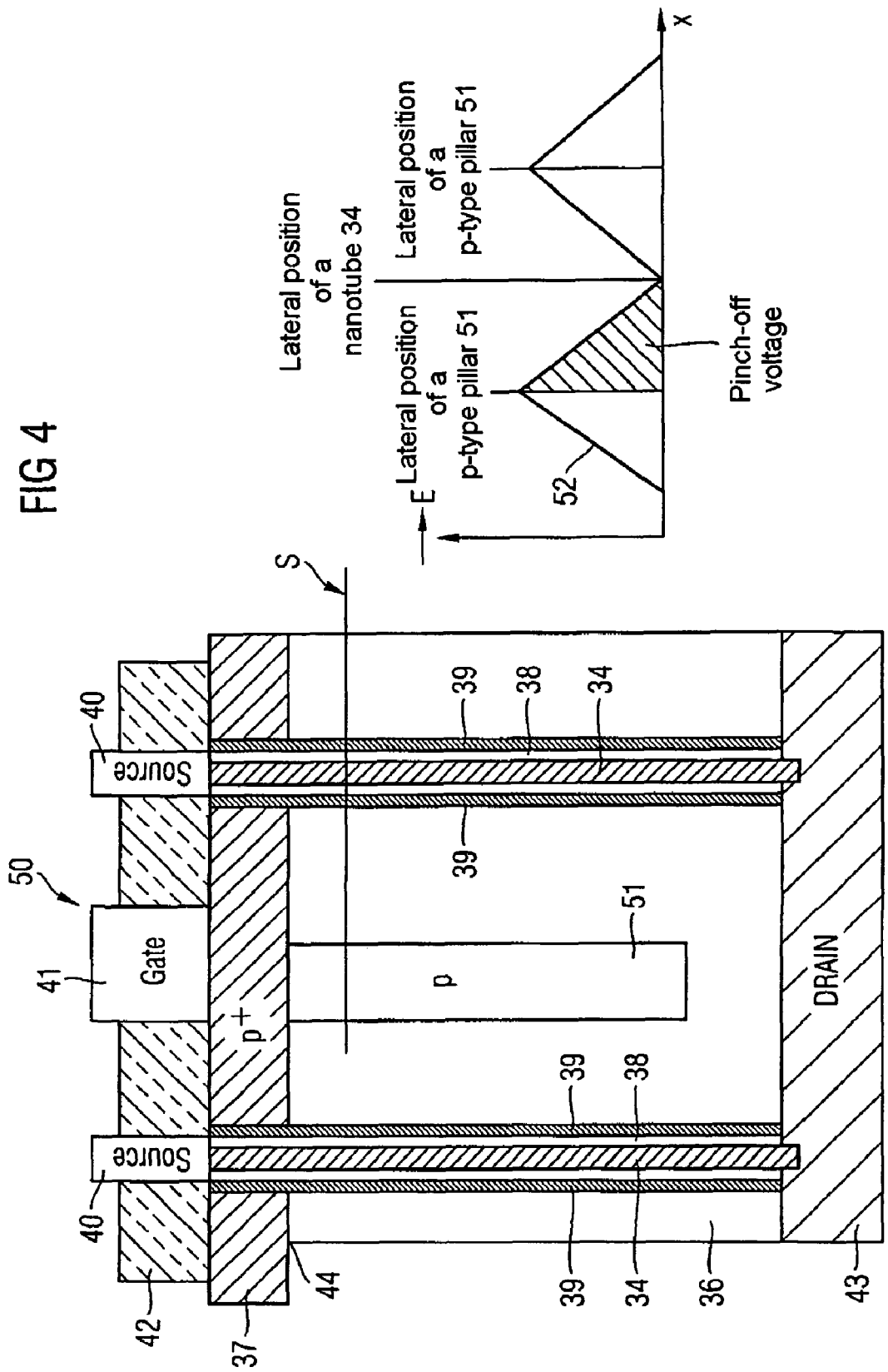
FIG. 4 shows a second embodiment of a power transistor according to the invention in a cross-sectional illustration.

The embodiment 50 shown in FIG. 4 differs from the embodiment shown in FIG. 1 merely by the fact that a compensation structure 51 is provided within the semiconductor body 33, to put it more precisely within the n-doped layer 36, said compensation structure being configured in strip-type or pillar-type fashion and comprising p-doped material. The compensation structure 51 is electrically connected to the p-doped layer 37 and responsible for the fact that charge carriers present in the semiconductor body 33 in the diode off-state case can be effectively depleted.

Shown on the right in FIG. 4 is the profile of the electric field strength along a sectional plane S (reference numeral 52).

While this invention has been described in terms of several preferred embodiments, there are alterations, permutations and equivalents that fall within the scope of this invention. For instance, nanowires may be used as an alternative to nanotubes. It should also be noted that there are many alternative ways of implementing the methods and compositions of the present invention. It is therefore intended that the following appended claims be interpreted as including such alterations, permutations and equivalents as falling within the true spirit and scope of the present invention.

What is claimed is:

1. A power transistor, comprising:
   a source region;
   a drain region;
   a semiconductor body arranged between the source region and the drain region;
   a plurality of nanotubes connected in parallel and disposed in the semiconductor body, the plurality of nanotubes being electrically insulated from the semiconductor body and electrically connecting the source and drain regions; and
   at least one diode formed in the semiconductor body, a portion of the at least one diode being configured to act as a gate electrode for the transistor.

2. The power transistor as claimed in claim 1, wherein the at least one diode is configured such that corresponding voltage profiles which occur in a diode off-state case within the at least one diode serve as gate potentials for switching of the power transistor.

3. The power transistor as claimed in claim 2, wherein the at least one diode is configured such that the gate potentials vary along a length of the nanotubes.

4. The power transistor as claimed in claim 1, wherein the semiconductor body has a layer of a first conduction type and a layer of a second conduction type arranged on the layer of the first conduction type, the layer of the second conduction type being electrically insulated from the source region; and
   wherein the at least one diode is formed from junctions between the layer of the first conduction type and the layer of the second conduction type.

5. The power transistor as claimed in claim 4, wherein the gate electrode is arranged on the layer of the second conduction type, the at least one gate electrode being configured to simultaneously function as an anode electrode of the at least one diode.

6. The power transistor as claimed in claim 5, wherein the drain region comprises a metal-containing layer, the metal-containing layer configured to simultaneously function as a transistor drain electrode and as a cathode electrode of the at least one diode.

7. The power transistor as claimed in claim 4, wherein at least one compensation structure of the second conduction type is provided in the layer of the first conduction type.

8. The power transistor as claimed in claim 7, wherein the at least one compensation structure comprises a pillar-type zone operably connected to the layer of the second conduction type.

9. The power transistor as claimed in claim 4, wherein the first conduction type is n type and the second conduction type is p type.

10. The power transistor as claimed in claim 1, wherein the at least one diode is configured such that corresponding voltage profiles which occur in a diode off-state case within the at least one diode are configured to pinch-off a current flow between the source region and the drain region through the nanotubes.

11. A power transistor comprising:
    a source region;
    a drain region;
    a semiconductor body arranged between the source region and the drain region;
    a plurality of nanotubes connected in parallel and disposed in the semiconductor body, the plurality of nanotubes being electrically insulated from the semiconductor body and electrically connecting the source and drain regions; and
    at least one diode formed in the semiconductor body, the at least one diode being configured such that corresponding voltage profiles which occur in a diode off-state case within the at least one diode serve as gate potentials for the switching of the power transistor.

12. The power transistor as claimed in claim 11, wherein the at least one diode is configured such that the gate potentials vary along a length of the nanotubes.

13. The power transistor as claimed in claim 12, wherein the semiconductor body has a layer of a first conduction type and a layer of a second conduction type arranged on the layer of the first conduction type, the layer of the second conduction type being electrically insulated from the source region; and
    wherein the diodes are formed from junctions between the layer of the first conduction type and the layer of the second conduction type.

14. The power transistor as claimed in claim 13, wherein at least one gate electrode is arranged on the layer of the second conduction type, the at least one gate electrode being configured to simultaneously function as a diode anode electrode.

15. The power transistor as claimed in claim 13, wherein the drain region comprises a metal-containing layer, the metal-containing layer configured to simultaneously function as a transistor drain electrode and as a diode cathode electrode.

16. The power transistor as claimed in claim 13, wherein at least one compensation structure of the second conduction type is provided in the layer of the first conduction type.

17. The power transistor as claimed in claim 16, wherein the at least one compensation structure comprises a pillar-type zone operably connected to the layer of the second conduction type.

18. The power transistor as claimed in claim 13, wherein the first conduction type is n type and the second conduction type is p type.

19. A power transistor, comprising:
    a source region;
    a drain region;
    a semiconductor body arranged between the source region and the drain region;
    a plurality of nanotubes connected in parallel and disposed in the semiconductor body, the plurality of nanotubes being electrically insulated from the semiconductor body and electrically connecting the source and drain regions; and
    at least one diode formed in the semiconductor body, the at least one diode being configured such that corresponding voltage profiles which occur in a diode off-state case within the at least one diode brings about a pinch-off of a current flow between the source region and the drain region through the nanotubes.

* * * * *